(12) United States Patent
Kamphuis et al.

(10) Patent No.: US 10,643,957 B2
(45) Date of Patent: May 5, 2020

(54) CONFORMAL DUMMY DIE

(71) Applicant: NXP B.V., Eindhoven (NL)

(72) Inventors: Antonius Hendrikus Jozef Kamphuis, Lent (NL); Amar Ashok Mavinkurve, Malden (NL); Jetse De Witte, Nijmegen (NL); Andrei-Alexandru Damian, Nijmegen (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/113,387

(22) Filed: Aug. 27, 2018

(65) Prior Publication Data

US 2020/0066653 A1 Feb. 27, 2020

(51) Int. Cl.
*H01L 23/31* (2006.01)
*H01L 23/00* (2006.01)
*H01L 23/495* (2006.01)
*H01L 21/56* (2006.01)
(Continued)

(52) U.S. Cl.
CPC .......... *H01L 23/562* (2013.01); *H01L 21/565* (2013.01); *H01L 23/3121* (2013.01); *H01L 23/49541* (2013.01); *H01L 24/05* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/94* (2013.01); *H01L 21/30625* (2013.01); *H01L 21/78* (2013.01); *H01L 2224/0401* (2013.01); *H01L 2224/29191* (2013.01); *H01L 2224/32225* (2013.01);
(Continued)

(58) Field of Classification Search
CPC .............. H01L 23/562; H01L 23/3121; H01L 23/49541; H01L 21/565; H01L 21/30625; H01L 21/78; H01L 24/94; H01L 24/92; H01L 24/83; H01L 24/85; H01L 24/05; H01L 24/73; H01L 24/48; H01L 24/32; H01L 2924/0715; H01L 2924/2064; H01L 2924/3511; H01L 2224/48463; H01L 2224/0401; H01L 2224/92247; H01L 2224/32245; H01L 2224/32225; H01L 2224/33181; H01L 2224/73265; H01L 2224/73215; H01L 2224/48175; H01L 2224/48106; H01L 2224/48091; H01L 2224/4845; H01L 2224/29191
See application file for complete search history.

(56) References Cited

U.S. PATENT DOCUMENTS 5,173,764 A 12/1992 Higgins, III
7,262,622 B2 8/2007 Zhao
(Continued)

FOREIGN PATENT DOCUMENTS

JP 2001308116 A 11/2001

*Primary Examiner* — Sitaramarao S Yechuri

(57) ABSTRACT

Embodiments of packaged semiconductor devices and methods of making thereof are provided herein, which include a semiconductor die having a plurality of pads on an active side; a dummy die having a plurality of openings that extend from a first major surface to a second major surface opposite the first major surface, wherein the plurality of openings are aligned with the plurality of pads; and a silicone-based glue attaching the dummy die to the active side of the semiconductor die, wherein a plurality of bondable surfaces of the semiconductor die are exposed through the plurality of openings of the dummy die.

15 Claims, 7 Drawing Sheets

(51) Int. Cl.
*H01L 21/78* (2006.01)
*H01L 21/306* (2006.01)

(52) U.S. Cl.
CPC ............... *H01L 2224/32245* (2013.01); *H01L 2224/33181* (2013.01); *H01L 2224/4845* (2013.01); *H01L 2224/48091* (2013.01); *H01L 2224/48106* (2013.01); *H01L 2224/48175* (2013.01); *H01L 2224/48463* (2013.01); *H01L 2224/73215* (2013.01); *H01L 2224/73265* (2013.01); *H01L 2224/92247* (2013.01); *H01L 2924/0715* (2013.01); *H01L 2924/2064* (2013.01); *H01L 2924/3511* (2013.01)

(56) References Cited

U.S. PATENT DOCUMENTS

| | | |
|---|---|---|
| 7,495,462 B2 | 2/2009 | Hua et al. |
| 7,732,299 B2 | 6/2010 | Chang et al. |
| 7,969,013 B2 | 6/2011 | Chen et al. |
| 7,985,659 B1 | 7/2011 | Hayes et al. |
| 8,053,277 B2 | 11/2011 | Yu et al. |
| 8,294,280 B2 | 10/2012 | Chandrasekaran |
| 8,502,373 B2 | 8/2013 | Kaskoun et al. |
| 8,557,680 B2 | 10/2013 | Chandrasekaran et al. |
| 2006/0043477 A1* | 3/2006 | Akram ............... G01R 1/07314 257/337 |
| 2012/0241955 A1* | 9/2012 | Law ........................ H01L 24/81 257/738 |
| 2014/0151717 A1* | 6/2014 | Otremba ................. H01L 21/50 257/77 |
| 2016/0289519 A1* | 10/2016 | Yasuda ................. C08G 77/08 |

\* cited by examiner

CONFORMAL DUMMY DIE

BACKGROUND

Field

This disclosure relates generally to packaged semiconductor devices, and more specifically, to protecting sensitive areas of a semiconductor die included in a packaged semiconductor device.

Related Art

A semiconductor die is a small integrated circuit (IC) formed on a semiconductor wafer, such as a silicon wafer. Such a die is typically cut from the wafer and is often packaged using a lead frame. The lead frame is a metal frame that supports the die and provides external electrical connections for the packaged die. The lead frame usually includes a die flag and lead fingers (or leads). The semiconductor die is attached to the flag and bond pads on the die are electrically connected to the leads of the lead frame with bond wires. The die and bond wires are covered with an encapsulant to form a semiconductor die package. The leads either project outwardly from the encapsulation or are at least flush with the encapsulation so they can be used as terminals, allowing the packaged die to be electrically connected to other devices or a printed circuit board (PCB).

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1A:
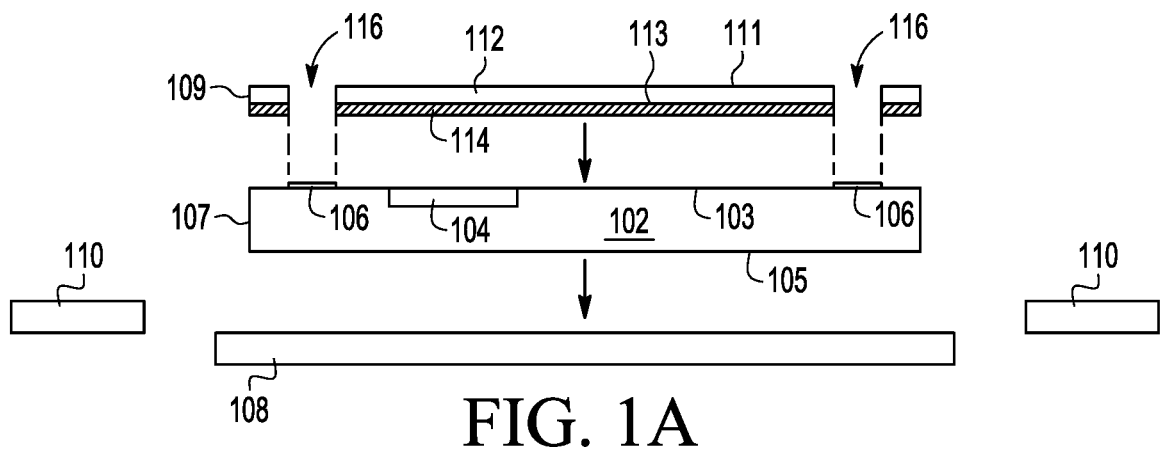
FIGS. 1A-1D, 2A-2D, and 3A-3C are block diagrams depicting various steps for fabricating an example packaged semiconductor device, according to some embodiments of the present disclosure.

The following sets forth a detailed description of various embodiments intended to be illustrative of the invention and should not be taken to be limiting.
Overview Certain areas on a top side or active side of a semiconductor die may be sensitive to stress, due to temperature variations in asymmetrical packages with CTE (coefficient of thermal expansion) mismatches. This may lead to severe mechanical stresses, such as high package warpage. Some conventional approaches include a stress buffer, such as a layer of polyimide or chip coating on the semiconductor die. However, such a layer covers the bond pads on the wafer, which require additional processing steps to expose the bond pads. Such chip coats are often thick (e.g., greater than 50 microns) and do not have sufficient placement accuracy for obtaining consistent results.

The present disclosure provides a protection solution, where a dummy die is attached to stress-sensitive areas on the active side of a semiconductor die with silicone-based glue. The dummy die includes a number of openings through the dummy die that align with the bond pads on the underlying semiconductor die, where each opening laterally surrounds one or more bond pads when attached to the semiconductor die. The dummy die is attached to the semiconductor die before forming external connections on the semiconductor die, such as before wire bonding or before solder ball drop, where wire bonds (such as ball bonds) or solder balls are formed on the bond pads through the openings in the dummy die.

While dummy die attachment may occur on an individual basis to each semiconductor die, some embodiments provide for attachment during a wafer level process, where a dummy die wafer may be attached to a semiconductor die wafer. In some embodiments, the dummy die wafer is first thinned to a predetermined thickness and then attached to the semiconductor die wafer. In other embodiments, the dummy die wafer having its original (production) thickness is first attached to the semiconductor die wafer, then the dummy die wafer is ground back to a desired thickness, which may be less than the predetermined thickness achieved by thinning the dummy die wafer before attachment. Dummy die wafer level attachment also protects the semiconductor die wafer during wafer test, backgrinding of the semiconductor die wafer, and singulation of the combination wafer (which includes the dummy die wafer attached to the semiconductor die wafer with silicone-based glue) into a plurality of individual devices, also referred to as combination die, where a combination die includes both a dummy die attached to a semiconductor die with silicone-based glue.

Additionally, thinning an individual dummy die wafer or an individual semiconductor die wafer may lead to wafer breakage (e.g., when the forces experienced during backgrinding exceed the mechanical strength of the individual dummy die wafer or the individual semiconductor die wafer). Dummy die wafer level attachment provides a reinforced combination wafer with improved mechanical strength that may reduce the risk of wafer breakage during backgrinding of the dummy die wafer or during backgrinding of the semiconductor die wafer. Dummy die wafer level attachment may also result in a combination wafer having a thinner dummy die wafer, a thinner semiconductor die wafer, or both, as compared with individually thinning the wafers before attachment.

The silicone-based glue provides an air tight and moisture resistant seal on the active side of the semiconductor die, protecting the sensitive areas on the active side from various stresses due to temperature variations or other mechanical sources. In some embodiments, silicone-based glue is selected for its resistivity to oxidation at high temperatures, which provides additional protection for the stress-sensitive areas even during extreme temperature excursions, such as during an electrostatic discharge (ESD) event or other event that causes the semiconductor die to operate outside of its normal operating parameters.

In some embodiments, the sensitive areas may underlie one or more bond pads. The dummy die provides protection of those underlying sensitive areas by covering the interstitial areas around and between the bond pads (e.g., between the wire bond connections formed to those bond pads). In some embodiments, pressure may also be applied to the dummy die to evenly distribute the silicone-based glue to form a consistent sealed barrier along the active side, as well as form fillets of the silicone-based glue over and around edges of the bond pads and sides of the wire bonds or other connection structure (such as solder balls or bumps). The fillets that contact the bond pads and wire bonds further seals these areas within the openings in the dummy die, which might otherwise be a void lacking the protective barrier formed by the glue.

Example Embodiments

FIG. 1A-1D show cross-sectional views of various steps in an example process flow for fabricating a packaged semiconductor device that includes a dummy die. FIG. 1A shows various components of a packaged semiconductor device, which includes a semiconductor die 102, a lead frame having a die flag 108 and a number of leads 110, and a dummy die 112. These components may be combined in a number of ways, as further discussed below.

Semiconductor die 102 has an active side 103 and an opposing back side 105. Semiconductor die 102 also has lateral or outer edges 107 that are perpendicular to active and back sides 103 and 105. Active side 103 includes a plurality of pads 106, which may be arranged in various locations on the active side 103. In the embodiment shown, pads 106 are located near a periphery of semiconductor die 102, although pads 106 may also be located centrally on semiconductor die 102 in other embodiments (e.g., like that shown in FIG. 3A). Pads 106 may be arranged in a layout on active side 103 that implements one or more regular patterns, such as rows, or one or more irregular patterns (e.g., like that shown in FIG. 3A), or both. Each pad 106 may be electrically coupled to active circuitry located on semiconductor die 102 near active side 103. A sensitive area 104 is also located on active side 103. Sensitive area 104 is an area of semiconductor die 102 that is sensitive to stress, such as thermal stress caused by temperature variations due to components having mismatched CTEs (coefficient of thermal expansion), mechanical stress caused by package warpage (e.g., encapsulant body warpage) or physical damage to the encapsulant body, or sensitive to other electrothemal stresses.

It is noted that a semiconductor die (like semiconductor die 102) may be formed from (e.g., singulated from) a semiconductor wafer, which is also referred to as a semiconductor die wafer, which may be any semiconductor material or combinations of materials, such as gallium arsenide, silicon germanium, silicon-on-insulator (SOI), silicon, monocrystalline silicon, the like, and combinations of the above. Active circuitry of a semiconductor die (like semiconductor die 102) is formed on a silicon wafer using a sequence of numerous process steps applied to the semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of active circuitry include but are not limited to integrated circuit components such as a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

Figure 1B:
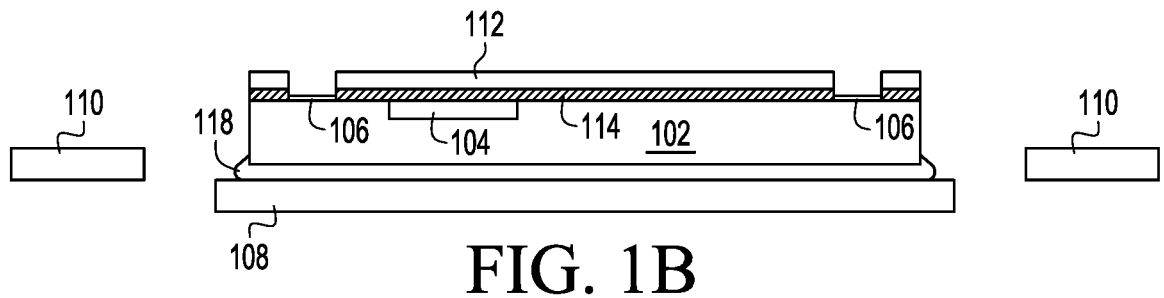

A lead frame is a conductive frame that mechanically supports one or more electronic components, such as a semiconductor die, that may be attached to the die flag of the lead frame (like semiconductor die 102 attached to die flag 108, shown in FIG. 1B), and provides external electrical connections for the components through the leads of the lead frame (like leads 110). A lead frame is formed from electrically conductive material, examples of which include but are not limited to copper, nickel, or other suitable conductive materials or alloy composed of one or more suitable conductive materials. Electrical connection contact areas on the leads 110 may also be coated with an electrically conductive material, examples of which include but are not limited to nickel, gold, copper, aluminum, tin, or other suitable conductive metal or alloy composed of one or more suitable conductive materials. The lead frame shown in FIG. 1A may be an individual lead frame, or may be a representative lead frame in a lead frame array that includes a plurality of lead frames.

A dummy die (like dummy die 112) is a portion of silicon or glass, which may be formed from (e.g., singulated from) a wafer, which is also referred to as a dummy die wafer. A dummy die wafer may be any semiconductor material or combinations of materials, such as gallium arsenide, silicon germanium, silicon-on-insulator (SOI), silicon, monocrystalline silicon, the like, and combinations of the above. Generally, a dummy die (like dummy die 112) has a thickness less than a semiconductor die. In some embodiments, dummy die 112 may have a thickness in a range of 10 to 100 microns, such as 50 microns. In some embodiments, dummy die 112 has a CTE (coefficient of thermal expansion) substantially similar to the CTE of the semiconductor die 102 (e.g., such as when both the dummy die 112 and the semiconductor die 102 are formed from a same or similar type of silicon). The thickness of the dummy die 112 may be achieved in a number of ways, including backgrinding before or after attachment to a semiconductor die wafer during a wafer level process, further discussed below.

Dummy die 112 does not include any internal active circuitry in order to achieve a sufficiently thin profile with a consistent CTE. Dummy die 112 includes a plurality of openings 116 that correspond to the layout of pads 106 on active side 103 of the semiconductor die 102. The openings 116 extend from a top surface 111 to a bottom surface 113 of the dummy die 112. Dummy die 112 also has lateral or outer edges 109 that are perpendicular to the top and bottom surfaces 111 and 113. Dummy die 112 is configured to be attached to the active side 103 of semiconductor die 102, with each opening 116 configured to align to and surround at least one pad 106 on the semiconductor die 102. In some embodiments, each opening 116 may be configured to surround more than one pad 106, as further discussed below in connection with FIG. 3A (e.g., where three pads 106 are surrounded by an opening 318).

Dummy die 112 is configured to cover a portion of the active side 103 that at least includes sensitive area 104 in order to protect sensitive area 104 from various stresses, as further discussed below in connection with FIG. 1B. In various embodiments, the size of the dummy die 112 may include up to the entirety of the size of the semiconductor die

Figure 6:
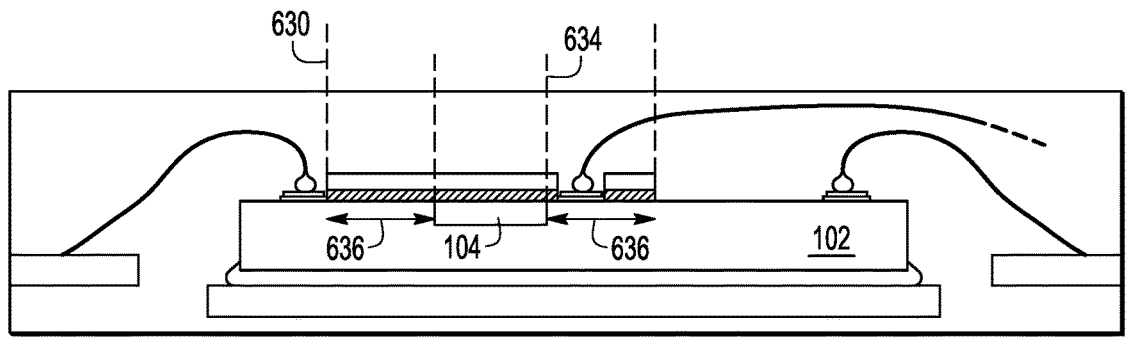
FIGS. 6, 7A-7B, and 8A-8D are block diagrams depicting other various aspects of example packaged semiconductor devices, according to some embodiments of the present disclosure.

102. For example, FIG. 1A shows dummy die 112 having a same (or substantially same) lateral size as the semiconductor die 102, where the lateral edges 109 of dummy die 112 are aligned with lateral edges 107 of the semiconductor die 102, and where openings 116 are aligned with the underlying pads 106 (as indicated by dashed lines). In such an embodiment, dummy die 112 covers the entirety of the active side 103 (including over sensitive area 104) when attached to the semiconductor die 102. Another embodiment is shown in FIG. 6, where dummy die 112 partially covers active side 103 (which at least includes over sensitive area 104) when attached to semiconductor die 102, including an opening 116 that surrounds at least one pad 106, as further discussed below.

As shown in FIG. 1A, a silicone-based glue 114 is applied to the bottom surface 113 of dummy die 112. The silicone-based glue 114 is configured to attach the dummy die 112 to the active side 103 of the semiconductor die 102, as further discussed below. A silicone-based glue 114 is a material that includes one or more silicone polymers having adhesive properties. A silicone polymer includes repeating units of siloxane, also referred to as polysiloxane, as a backbone structure to which other elements, organic groups, or functional groups may attach. In the embodiment shown, silicone-based glue 114 generally has a low modulus and gel-like viscosity to form a thin, flexible, and compliant adhesive layer that substantially remains in place on dummy die 112 without blocking openings 116. In some embodiments, the layer of silicone-based glue 114 may have a thickness in a range between 20 and 50 microns, such as 30 microns. In some embodiments, the layer of silicone-based glue 114 may have a greater thickness, such as in a range of 50 to 100 microns. When attaching the dummy die 112 to the semiconductor die 102, pressure may be applied to the dummy die 112 to ensure the silicone-based glue 114 makes sufficient contact with active side 103, as well as to spread glue 114 to eliminate any voids on the active side 103 or to laterally surround a connection like a wire bond or solder ball, as further discussed below in connection with FIGS. 5C and 7B. In some embodiments, silicone-based glue 114 is preferably selected based on its resistance to oxidation at high temperatures (e.g., 350° C. or greater), as further discussed below.

FIG. 1A illustrates attachment of an individual dummy die 112 to an individual semiconductor die 102 with silicone-based glue 114, where the dummy die 112 may be singulated from a dummy die wafer. In some embodiments, the silicone-based glue 114 may be applied to an entire dummy die wafer and the dummy die wafer may then be singulated into a plurality of dummy dies 112, each having a layer of silicone-based glue 114 on bottom surface 113, for individual attachment like that shown in FIG. 1A. Such embodiments may be beneficial when the dummy die 112 has a smaller lateral size or footprint than the lateral size of the semiconductor die 102.

In other embodiments where the dummy die 112 has a same or substantially same lateral size as the semiconductor die 102, the silicone-based glue 114 may be applied to the entire dummy die wafer and then attached to a semiconductor die wafer as a wafer level process. In such embodiments, the dummy die wafer may be first thinned and then attached to semiconductor die wafer (as discussed below in connection with FIG. 4A-4D) or the dummy die wafer may be first attached with its production thickness to semiconductor die wafer and then thinned (as discussed below in connection with FIG. 9A-9C). The resulting combined wafer may then be singulated into a plurality of combination dies, each of which include a dummy die 112 attached to a semiconductor die 102 having a structure like that shown in FIG. 1B (which may then be attached to the die flag 108 with die attach material 118, as discussed below).

It is noted that the dummy die wafer may be formed from a blank wafer having an original or production thickness, where a number of recesses having some depth may be formed in a surface of the dummy die wafer. In some embodiments, the dummy die wafer is thinned to have a thickness corresponding to the depth of the recesses in order to expose or open the recesses to form openings 116 through the dummy die wafer. The dummy die wafer may be thinned before attachment (as discussed below in connection with FIG. 4A-4C) or after attachment (as discussed below in connection with FIG. 9A-9C). It is also noted that the resulting dummy die wafer shown in FIG. 4B, FIG. 4C, or FIG. 5A may further be singulated into individual dummy die 112 for individual attachment, in some embodiments.

In some embodiments, the silicone-based glue 114 may be in an amorphous form when applied (which may be a beneficial form for spraying, screen-printing, or spin coating) to the dummy die 112 or to the dummy die wafer, preferably with sufficient viscosity to prevent unintended smearing or spreading. In some embodiments, the silicone-based glue 114 may be provided as a pressure sensitive adhesive (e.g., as a film preform) that provides sufficient adhesion when pressed to the dummy die 112 or to the dummy die wafer. In some embodiments, the silicone-based glue 114 may provide sufficient adhesion to the dummy die 112 or to the dummy die wafer (and to the semiconductor die 102) without a curing step.

In some embodiments, the silicone-based glue 114 may be a curable material that can be applied to the dummy die 112 or to the dummy die wafer. For example, glue 114 may have a lower viscosity when applied (e.g., sprayed, screen-printed, or spin coated) to a dummy die 112 or to a dummy die wafer, and then may be partially cured (e.g., exposed to heat or to ultraviolet (UV) light to trigger a cross-linking reaction to partially stiffen the lower viscosity glue) to form a layer of higher viscosity glue 114. In some embodiments, the glue 114 may be fully cured (e.g., the cross-linking reaction is completed by heat or UV light exposure to form a solid polymer layer) once the dummy die 112 is attached to the semiconductor die 102, as shown in FIG. 1B.

In another example, glue 114 may be provided as a B-stage film preform. The B-stage film preform may be large enough to cover an individual dummy die 112 or an entire dummy die wafer. In some embodiments, the B-stage film preform may be a solid sheet or may include a number of openings that correspond to openings 116 in either an individual dummy die 112 or in an entire dummy die wafer. In some embodiments, the B-stage film preform may be fully cured once the dummy die 112 is attached to the semiconductor die 102, as shown in FIG. 1B.

FIG. 1B shows the dummy die 112 attached to the active side 103 of the semiconductor die 102 with silicone-based glue 114, while pads 106 remain exposed through both the dummy die 112 and the glue 114, providing a bondable surface. The silicone-based glue 114 forms an air tight and water-resistant seal at the surface of the semiconductor die 102, preventing oxygen and various contaminants in the ambient environment from reaching sensitive area 104. For example, an electronic device may on rare occasion experience electrical overstress, where an electrical signal outside of the device's normal operating range is received, such as when a capacitor discharges through a back-gate diode where active on-device protection may not always be possible. Electrical overstress may cause the device to operate outside of normal parameters, causing temperature excursions that may reach into hundreds of degrees (e.g., 350° C. or greater). If an encapsulant body is present around the device, the high temperatures may cause oxidation and damage to the encapsulant body such that the underlying device may be exposed to contaminant ions from the ambient environment that put the device at risk for electromigration failure that may in turn cause electrothermal failure, as well as possible physical damage due to debris. By contrast, the silicone-based glue 114 present over the active side 103 of the semiconductor die 102 is configured to remain intact during similar temperature excursions, which protects the underlying sensitive area 104 from ambient environment exposure, even if the encapsulant body becomes damaged. In some embodiments, it is preferred that the silicone-based glue 114 surrounds the sensitive area 104 by a minimum lateral margin or distance to ensure that the sensitive area 104 is sufficiently sealed, as further discussed below in connection with FIG. 6.

As noted above, the dummy die 112, semiconductor die 102, and lead frame shown in FIG. 1A may be combined in a number of ways to result in the device shown in FIG. 1B. In some embodiments, the dummy die 112 may be first attached to the active side 103 of the semiconductor die 102 (shown as the top arrow in FIG. 1A), and then the back side 105 of the semiconductor die 102 is attached to die flag 108 with die attach material 118 (shown as the bottom arrow in FIG. 1A). In other embodiments, the back side 105 is first attached to the die flag 108 with die attach material 118 (bottom arrow in FIG. 1A), and then the dummy die 112 is attached to the active side 103 (top arrow of FIG. 1A). Further, in embodiments where a combination die is formed (e.g., the dummy die wafer and the semiconductor die wafer are attached and singulated into a plurality of combination die), the back side 105 of the semiconductor die 102 present in the combination die is attached to the die flag 108 with die attach material 118.

Die attach material 118 has adhesive properties to attach the semiconductor die 102 to die flag 108, as well as thermal conductive properties to transfer heat from the semiconductor die 102 to the die flag 108. Examples of die attach material 118 include but are not limited to, solder alloys, polyimides, silicone or epoxy-resin based material containing suspended filler such as carbon nanotubes, or beryllium oxide, aluminum nitride, boron nitride, or diamond powders, and the like.

Figure 1C:
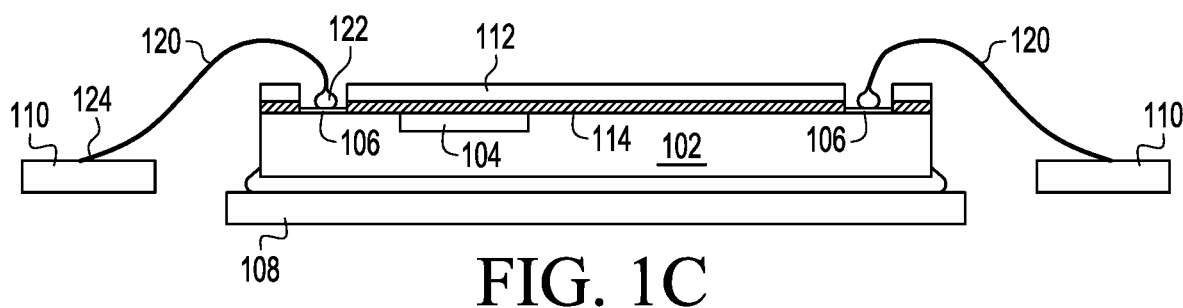

FIG. 1C shows the resulting device after a wire bonding step is performed to create a plurality of wire bond connections 120. Each wire bond connection 120 includes a first wire bond 122, such as a ball bond, formed on a respective pad 106, with a wire extending from the first wire bond to a second wire bond 124, such as a stitch or tail bond, formed on a respective lead 110. In the embodiment shown, each opening 116 closely follows a perimeter of a respective pad 106, allowing a wire bond to be formed through the opening 116 in the dummy die 112 onto a bondable surface of the pad 106, while the silicone-based glue 114 remains outside of the perimeter of the respective pad 106. In some embodiments, the perimeter of the opening 116 may be larger than the underlying pad 106, such as 50 microns laterally separating the larger perimeter of opening 116 from the perimeter of underlying pad 106. This also provides some tolerance in the accuracy needed to place and attach the dummy die 112 onto semiconductor die 102. The tolerance is further improved when the dummy die 112 and semiconductor die 102 are attached at wafer level, as further discussed below (e.g., +/−5 microns accuracy is sufficient).

Figure 5A:
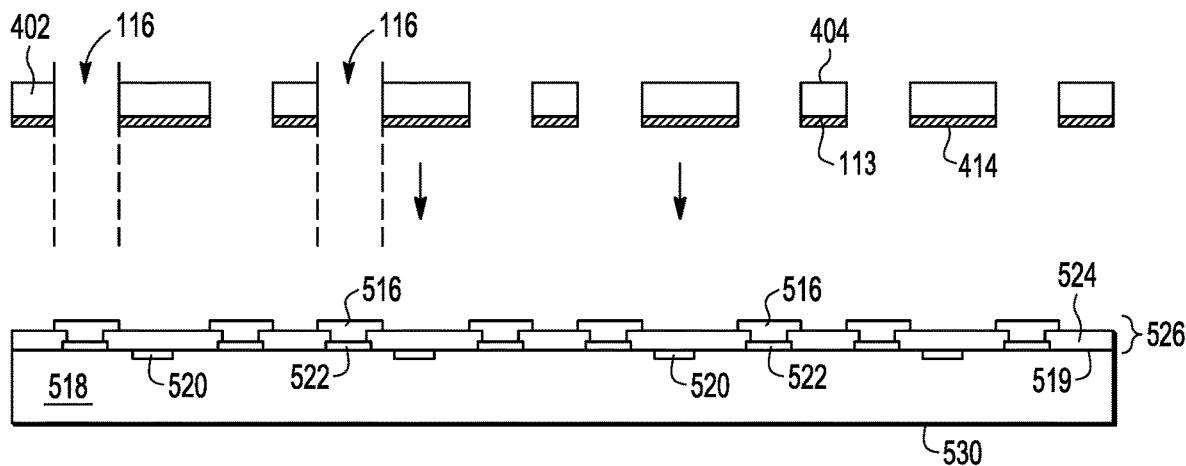
Figure 5B:
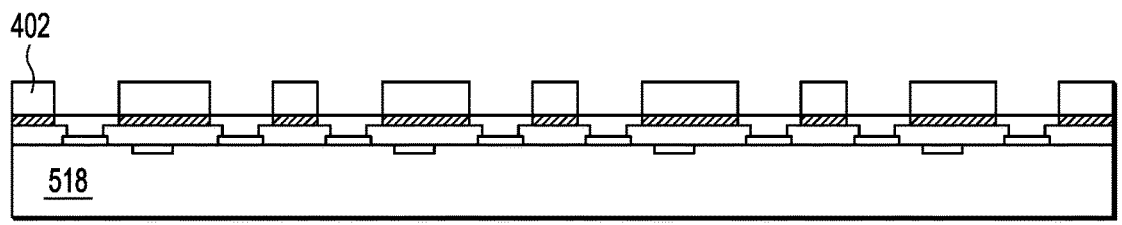
Figure 5C:
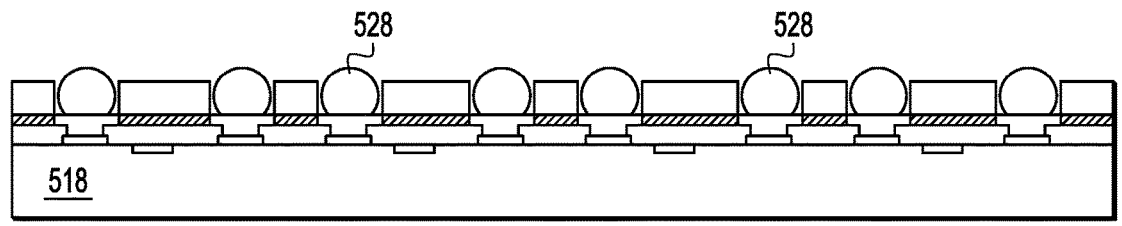

In some embodiments, other connections may be formed on pads 106, such as solder balls or bumps, like that shown in FIG. 5C. In some embodiments, each pad 106 may include a coating of one or more conductive materials that improve wettability and adhesion of the connections (such as wire bonds or solder balls) to pads 106, examples of which include but are not limited to nickel, gold, copper, aluminum, titanium, tungsten, chromium, palladium, or other suitable conductive metal or alloy composed of one or more suitable conductive metals. A solder mask may also be implemented around pads 106 to form solder-mask-defined (SMD) pads or non-solder-mask-defined (NSMD) pads, in various embodiments.

Figure 1D:
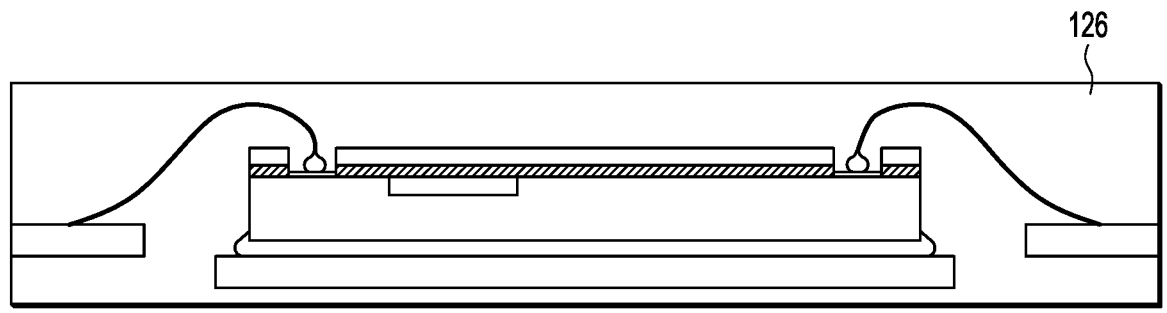

FIG. 1D shows the resulting device after an encapsulation step is performed to create an encapsulant body 126 that encapsulates the die flag 108, the semiconductor die 102, the dummy die 112, and the wire bond connections 120. While the leads 110 are shown as ending at the outer perimeter of the encapsulant body 126 in FIG. 1D, the leads 110 may extend past the outer perimeter of encapsulant body 126 in other embodiments. While the die flag 108 is covered by encapsulant body 126 in FIG. 1D, the die flag 108 may be exposed through encapsulant body 126 in other embodiments. In some embodiments, encapsulant body 126 is made of an encapsulant material such as a mold compound based on a biphenyl type or multi-aromatic type epoxy resin, but may be other types of encapsulating materials in other embodiments. The encapsulating may be performed by an encapsulating method, such as transfer molding, film assisted molding, glob top, dam and fill, underfill, lamination, or other types of other encapsulating methods.

It is noted that the device shown in FIGS. 1B, 1C, and 1D and throughout the figures may be an individual device (such as a device formed on a lead frame or a device formed from an individual die), or may be a representative device of a plurality of devices (such as multiple devices formed on a lead frame array or multiple devices formed as part of a wafer). In some embodiments, a plurality of devices are formed on a lead frame array and a trim and form step may be performed after the encapsulating step to singulate or separate each lead frame from the lead frame array. In some embodiments, a trim and form step may also include forming or shaping the leads 110 that extend past the outer perimeter of the encapsulant body 126, such as into J-shaped or gull-wing leads.

Figure 2A:
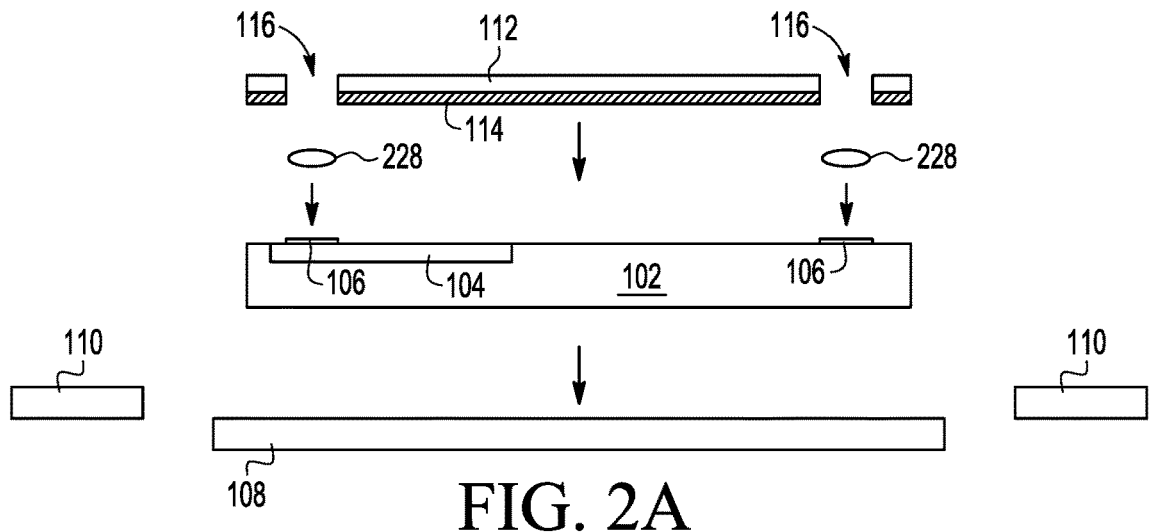

FIG. 2A-2D show cross-sectional views of various steps in another example process flow for fabricating a packaged semiconductor device that includes a dummy die. FIG. 2A shows various components of a packaged semiconductor device, which similarly includes a semiconductor die 102, a lead frame having a die flag 108 and a number of leads 110, and a dummy die 112, as discussed above. It is also noted that the sensitive area 104 may be located underneath one or more pads 106, as shown in FIG. 2A.

In addition, FIG. 2A shows a number of stud bumps 228 that are formed on the pads 106 (shown as middle short arrows in FIG. 2A). Stud bumps 228 may be formed using a wire bonding tool, such as a capillary tool, such as by attaching a wire free air ball to the bondable surface of pad 106. In some embodiments, each stud bump 228 is preferably formed as a flattened bump that covers a large portion of the pad 106 to provide a top bondable surface. Stud bumps 228 may be formed from one or more conductive materials, examples of which include but are not limited to limited to nickel, gold, copper, aluminum, tin, or other suitable conductive metal or alloy composed of one or more suitable conductive materials.

Figure 2B:
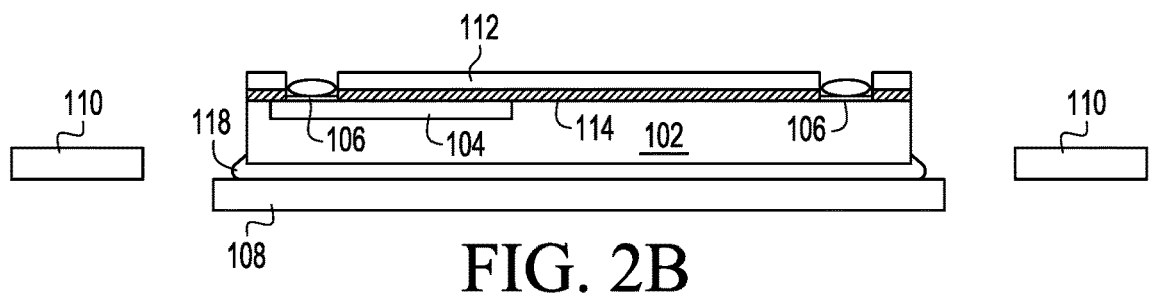

The components shown in FIG. 2A may be combined in a number of ways to result in the device shown in FIG. 2B. Preferably, the stud bumps 228 are first attached to the pads 106 in order to ensure bondable surfaces that are free of silicone-based glue 114 when dummy die 112 is attached to semiconductor die 102 (e.g., when glue 114 has a lower viscosity). The dummy die 112 and semiconductor die 102 may be attached in an order similar to that described above (e.g., top arrow then bottom arrow, or bottom arrow then top arrow). In some embodiments, the stud bumps 228 may be attached to the pads 106 after the dummy die 112 is attached to the semiconductor die 102, when silicone-based glue 114 remains outside of the perimeter of the pads 106.

Figure 2C:
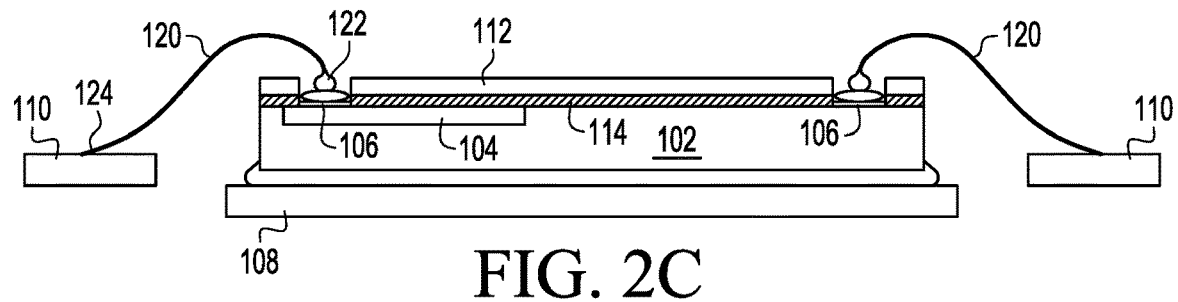
Figure 2D:
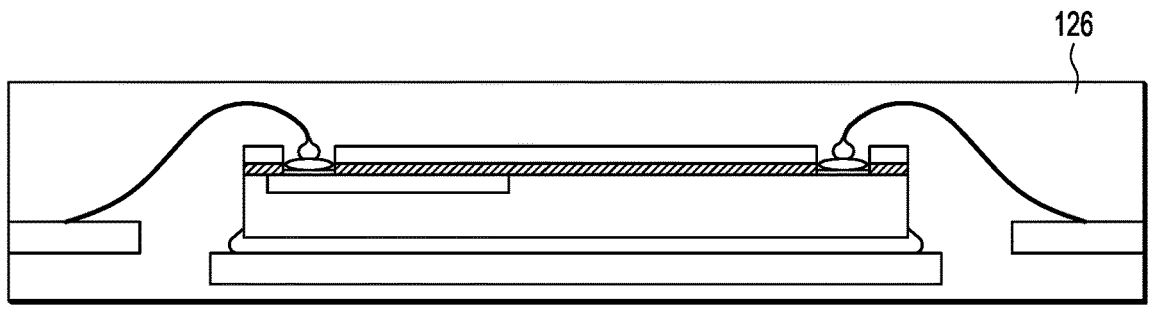

FIG. 2B shows the resulting device after the components are attached. FIG. 2C shows the resulting device after a wire bonding step is performed to create a plurality of wire bond connections 120. The first wire bond 122 is formed on the bondable surface provided by the stud bump 228, where the silicone-based glue 114 may laterally surround the stud bump 228 without covering the stud bump 228. In the embodiment shown, each opening 116 closely follows a perimeter of a respective pad 106, allowing a bond to be formed through the opening 116 in the dummy die 112 onto the stud bump 228. FIG. 2D shows the resulting device after an encapsulating step is performed to create an encapsulant body 126 that encapsulates the die flag 108, the semiconductor die 102, the dummy die 112, the stud bumps 228, and the wire bond connections 120. In some embodiments, a trim and form step may also be performed after encapsulating.

Figure 3A:
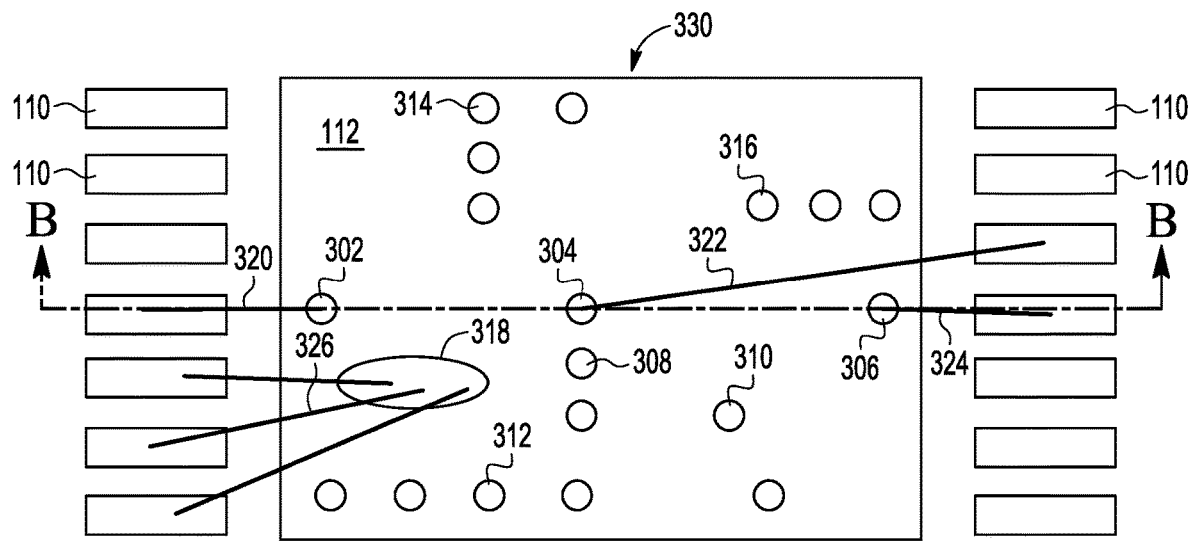
Figure 3B:
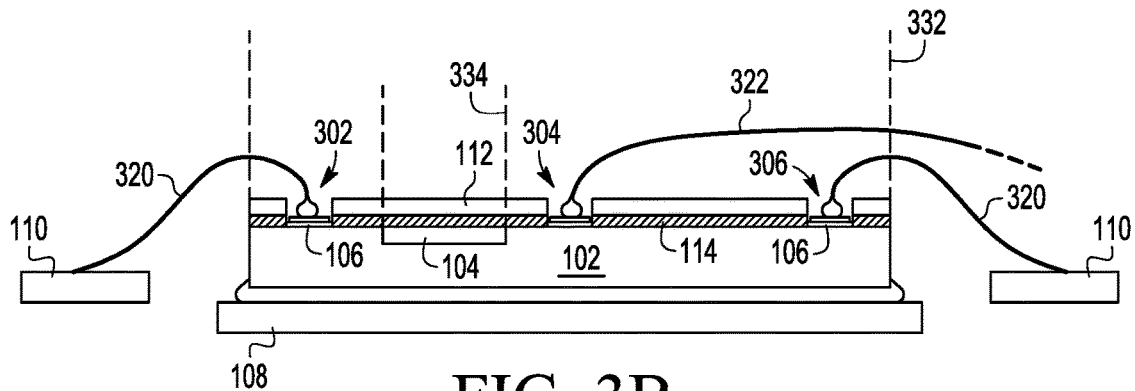

FIG. 3A shows a top-down view and FIG. 3B shows a cross-sectional view (at plane B) of an example device after dummy die 112 is attached to semiconductor die 102, and semiconductor die 102 is attached to die flag 108. Dummy die 112 covers at least a portion of active side 103 that includes the sensitive area 104 outlined by perimeter 334 (e.g., perimeter 330 laterally surrounds perimeter 334). In the embodiment shown, dummy die 112 has an outer perimeter 330 that is substantially aligned to an outer perimeter 332 of the underlying semiconductor die 102 (e.g., a lateral size of dummy die 112 corresponds with a lateral size of semiconductor die 102). FIGS. 3A and 3B also show the example device after at least part of a wire bonding step has been performed.

A number of example openings 302-318 through dummy die 112 are shown. Some openings (like openings 302, 306, 312, and 314) may be located near the periphery or outer edge of the dummy die 112, which correspond to pads 106 located near the periphery or outer edge of the semiconductor die 102. Other openings like (openings 304 and 308) are located near the center of the dummy die 112, which corresponds to pads near the center of the semiconductor die 102. Some openings (like 304 and 308) are located in a regular pattern such as a row, while other openings (like 310) are located in an irregular pattern. While some openings (like 302 and 304) may have a perimeter that closely follows the perimeter of a single underlying pad 106 (e.g., the perimeter of the opening is substantially equal to the perimeter of the underlying pad 106 or to a perimeter of a bondable surface of the underlying pad 106 defined by a solder mask), some openings (like 318) may have a perimeter that is larger than the perimeter of the underlying pad 106. For example, opening 318 is large enough to laterally surround three pads.

Figure 3C:
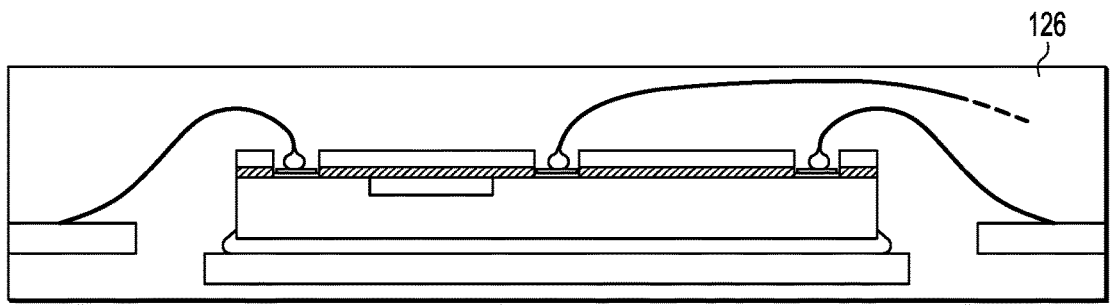

Pads 106 may also include a coating that provides a bondable surface for a wire bond, or may include a stud bump like stud bump 228 that provides a bondable surface for a wire bond. Example wire bond connections 320, 322, and 324 are also shown between a respective pad 106 and a respective lead 110, each having a wire bond respectively formed within openings 302, 304, and 306. FIG. 3C shows a cross-sectional view of the resulting device after an encapsulating step is performed to form encapsulant body 126 around the die flag 108, the semiconductor die 102, the dummy die 112, and the wire bond connections 120.

FIG. 6 shows a cross-sectional view of an example packaged semiconductor device similar to the device shown in FIG. 3B. The device shown in FIG. 6 includes a dummy die 112 that covers a portion of the active side 103 that is less than the entirety of the semiconductor die 102, where the portion covered includes sensitive area 104. In the embodiment shown, the dummy die 112 has a perimeter 630 that extends beyond the perimeter 634 of the underlying sensitive area 104 by a lateral margin or distance 636 to ensure silicone-based glue 114 seals the active side 103 above and around sensitive area 104 to protect sensitive area 104. In the embodiment shown, dummy die 112 laterally surrounds at least one pad 106, where a wire bond is formed within opening 116.

Figure 4A:
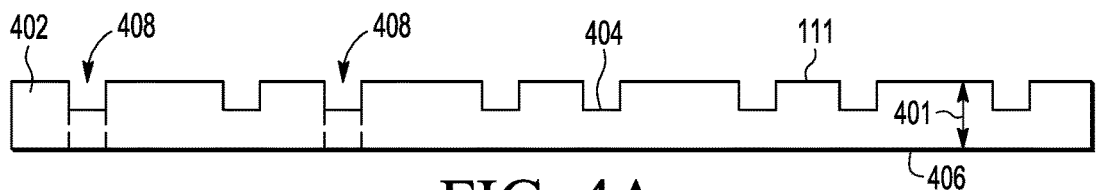
FIGS. 4A-4F and 5A-5D are block diagrams depicting various wafer level steps for fabricating an example semiconductor device, according to some embodiments of the present disclosure.

FIG. 4A-4F show cross-sectional views of various steps of an example process flow for fabricating an example device at wafer level. FIG. 4A shows an example dummy die wafer 402 that includes a plurality of dummy dies 112. Dummy die wafer 402 is formed from a blank wafer having an original or production thickness 401 between a present top surface 111 and a present bottom surface 406. A number of recesses 408 are formed in the top surface 111 to a depth 404 that is substantially equivalent to the target thickness of the resulting dummy dies 112. The recesses 408 may be formed by laser or micro-drilling or plasma dicing or etching, where the recesses 408 correspond to the layout of pads 106 on a semiconductor die wafer 418 (shown as dashed lines in FIG. 4A-4C that show recesses 408 aligned with underlying pads 422 on wafer 418). In some embodiments (not shown), a layer of silicone-based glue 414 may be formed on the top surface 111 before the recesses 408 are formed, where the recesses 408 are formed through both the silicone-based glue 414 and the dummy die wafer 402.

Figure 4B:
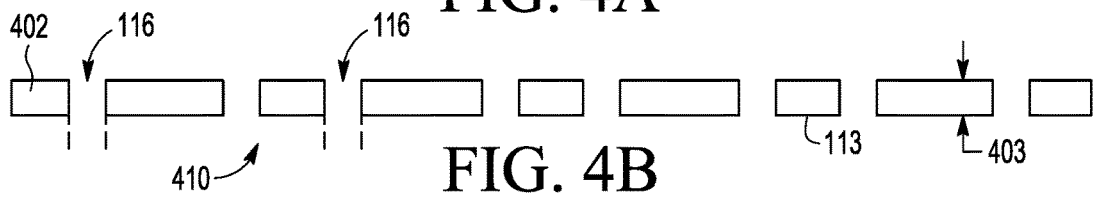

FIG. 4B shows the dummy die wafer 402 after a backgrinding step 410 has been performed, which thins wafer 402 to a new thickness 403 by removing a portion of the dummy die wafer 402 from bottom surface 406 to depth 404, which reveals a new bottom surface 113. The backgrinding also exposes recesses 408 through the bottom surface 113 to form openings 116 that extend through the dummy die wafer 402. In some embodiments, backgrinding may be performed using a chemical-mechanical polishing (CMP) or other planarization method.

Figure 4C:
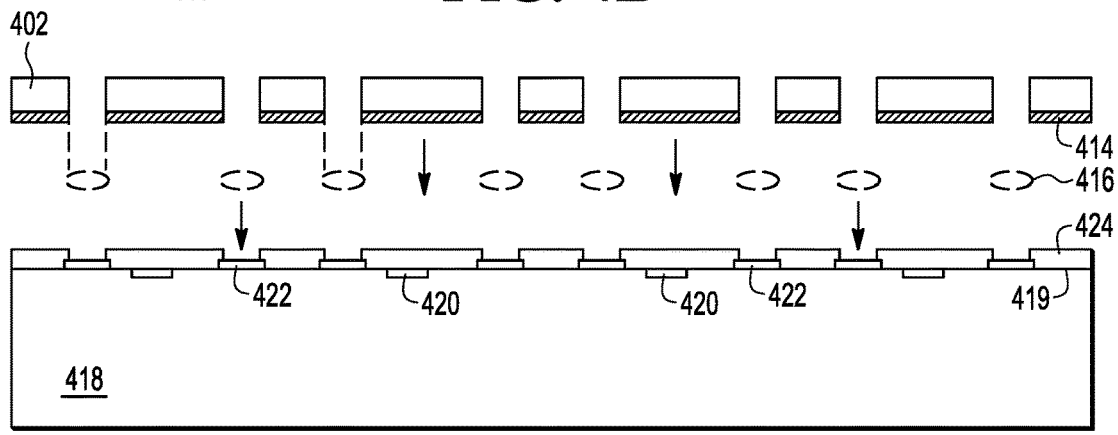

FIG. 4C also the dummy die wafer 402 after a layer of silicone-based glue 414 is applied to bottom surface 113 after the backgrinding step 410. In other embodiments, a layer of silicone-based glue 414 may be applied to top surface 111 before the backgrinding step 410 is applied to bottom surface 406, where the resulting dummy die wafer 402 is flipped to have the silicone-based glue 414 facing semiconductor die wafer 418 (as discussed below in connection with FIG. 9A-9C) to have a resulting structure similar to that shown in FIG. 4D. In some embodiments, a laser or a plasma cleaning step may be performed on dummy die wafer 402 (which may be formed by any of the embodiments discussed herein) to clean out and remove any glue 414 that may be blocking the openings 116.

FIG. 4C also shows semiconductor die wafer 418, which has a plurality of semiconductor dies 102 and is shown in an active side face-up orientation, where the active side 419 of the semiconductor die wafer 418 includes a number of sensitive areas 420 and a number of pads 422. A dielectric layer or solder mask 424 is also shown on the active side 419 of the wafer 418 to define bondable surfaces of pads 422 (e.g., solder mask 424 may overlap edges of pads 422 to form solder-mask pads or may be laterally separated from edges of pads 422 to form non-solder-mask pads, in various embodiments). FIG. 4C also shows an optional step of forming stud bumps 416 (shown in dashed outline) on the bondable surfaces of pads 422 before placing and attaching dummy die wafer 402 to the active side 419 of the semiconductor die wafer 418, in some embodiments.

Figure 4D:
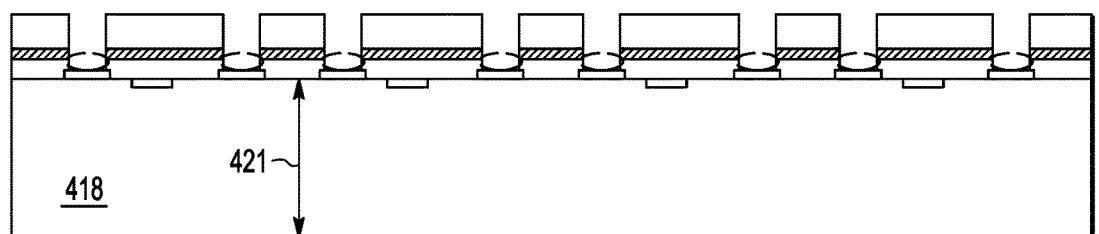

FIG. 4D shows the dummy die wafer 402 attached to semiconductor die wafer 418 using the silicone-based glue 414, where wafer 418 has a production thickness 421 between active side 419 and back side 426. The silicone-based glue 414 provides an air tight seal along the active side 419 of wafer 418. In some embodiments, silicone-based glue 414 may be cured to form a solid polymer layer. Wafer 402 attached to wafer 418 with glue 414 may also be referred to as a combination wafer.

Figure 4E:
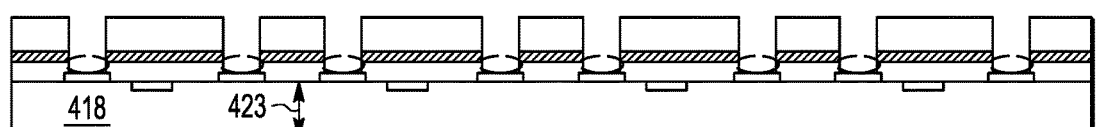

FIG. 4E shows the resulting combination wafer after a backgrinding step 428 is performed, which thins wafer 418 to a new thickness 423 by removing a portion of wafer 418 from back side 426 to reveal a new back side 430. In some embodiments, the attachment of dummy die wafer 402 to semiconductor die wafer 418 provides additional structural support that allows backgrinding step 428 to remove a larger portion from back side 426 and produces an overall thinner wafer 418, as compared with backgrinding wafer 418 without wafer 402.

Figure 4F:
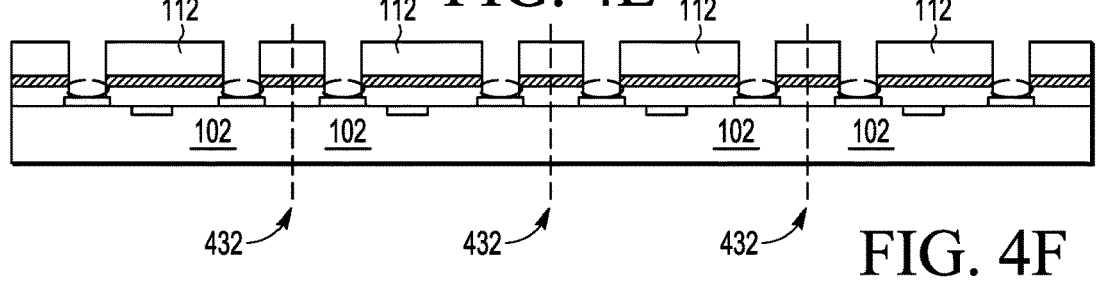

FIG. 4F shows a singulation step 432 that separates the combination wafer into a plurality of devices, each device including a semiconductor die 102 and an attached dummy die 112. Each singulated device may then be attached to a lead frame like that shown in FIGS. 1B, 2B, and 3B and assembled into a packaged semiconductor device, as described above.

FIGS. 5A-5D show cross-sectional views of various steps of an example process flow for fabricating an example device at wafer level, which may be beneficial for wafer level chip scale packages (WLCSP). FIG. 5A shows an example dummy die wafer 402 having a number of openings 116 that extend from top surface 111 to bottom surface 113. Dummy die wafer 402 also has a layer of silicone-based glue 414 on bottom surface 113. Dummy die wafer 402 may be produced according to any of the approaches discussed above.

FIG. 5A also shows a semiconductor die wafer 518 in an active side face-up orientation, where the active side 519 of the semiconductor die wafer 518 includes a number of sensitive areas 520 and a number of pads 522. In the embodiment shown, a number of redistribution layers (RDL) or build-up layers 526 are formed on the active side 519 of the semiconductor die wafer 518. Build-up layers 526 may include a number of metallization layers and dielectric layers. In the embodiment shown, build-up layers 526 include dielectric layer 524 and under-bump metallization (UBM) pads 516 formed on pads 522. In some embodiments, build-up layers 526 may include metallization layers that implement traces (e.g., implement redistributed routing paths) from pads 522 to the UBM pads 516. UBM pads 516 are formed from a thin film stack of one or more electrically conductive metals, examples of which include but are not limited to nickel, gold, copper, aluminum, titanium, tungsten, chromium, palladium, or other suitable conductive material or alloy composed of one or more suitable conductive materials. UBM pads 516 improve wettability and adhesion of external connections (such as solder bumps 528). In some embodiments, UBM pads 522 may be formed using an electroless plating process to form a stack of nickel, palladium, and gold in a "mushroom" shape having edges that overlap the dielectric layer 524. UBM pads 522 may also be referred to as NSMD pads. Openings 116 in dummy die wafer 402 align to pads 522 (shown in dashed outline). It is also noted that in the embodiment shown, a backgrinding step has already been performed on semiconductor die wafer 518.

FIG. 5B shows the resulting combination wafer when dummy die wafer 402 is attached to semiconductor die wafer 518 using silicone-based glue 414. FIG. 5C shows a plurality of solder balls or bumps 528 attached to the UBM pads 522. It is noted that openings 116 are large enough to laterally surround the solder bumps 528. In the embodiment shown, perimeters of openings 116 closely follow the perimeter of the UBM pads 522. In other embodiments, it may be preferred to have perimeters of openings 116 larger than the perimeter of UBM pads 522 to allow solder bumps 528 to wet down the sides of UBM pads 522.

Figure 5D:
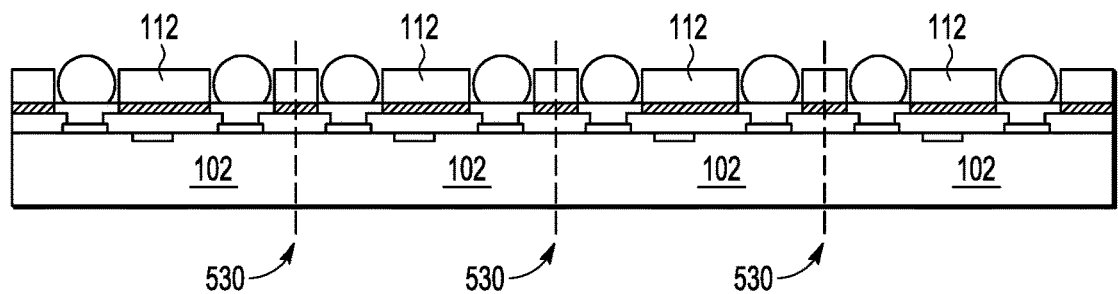

It is also noted that in some embodiments, the dummy die wafer 402 may be pressed downward onto semiconductor die wafer 518, which may spread silicone-based glue 414 into any voids on the active side 519 such as between the sides of UBM pads 522 and the dummy die wafer 402 and to laterally surround a pad 522 or connection like a solder ball 528, which may also be referred to as glue fillets. The glue fillets extend the air tight seal up to the sides of UBM pads 522, sides of solder balls 528, or both, where these areas of the active side 519 might otherwise be exposed to the ambient environment if the glue fillets were not present. Glue fillets may be especially beneficial when a sensitive area 104 extends under a pad. FIG. 5D shows a singulation step 530 that separates the combination wafer into a plurality of devices, each device including a semiconductor die 102 and a dummy die 112 and external connections 528.

Figure 7A:
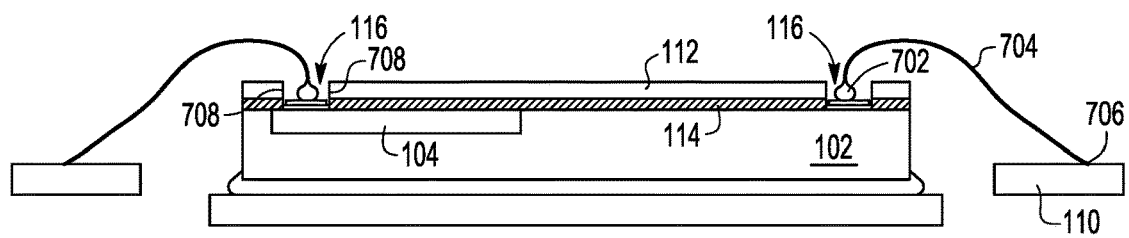

FIG. 7A shows a cross-sectional view of an example packaged semiconductor device that includes dummy die 112 attached to semiconductor die 102 with silicone-based glue 114. Dummy die 112 includes a number of openings 116 that have inner side walls 708. In the embodiment shown, side walls 708 are substantially vertical, but may be differently sloped in other embodiments, as discussed below in connection with FIG. 8A-8D. A number of wire bond connections 704 have been formed, which includes a first wire bond 702 formed on a bondable surface of a respective pad 106 exposed within each opening 116 and a second wire bond 706 formed on a bondable surface of a respective lead 110. It is noted that semiconductor die 102 includes a sensitive area 104 that extends underneath a pad 106. In the embodiment shown, silicone-based glue 114 is flexible and compliant and may be spreadable when pressure is applied.

Figure 7B:
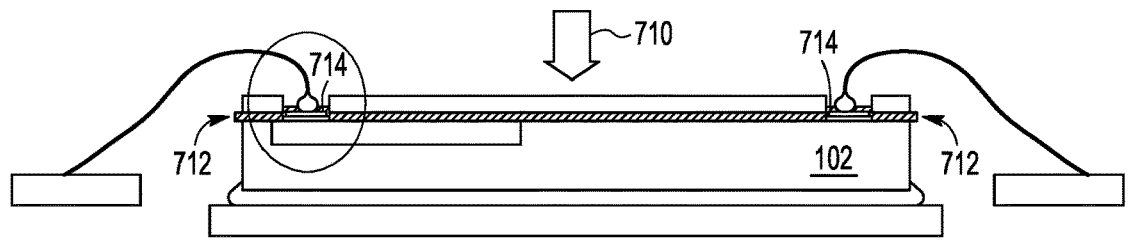

FIG. 7B shows a cross-sectional view of the device when pressure 710 (shown as large arrow 710) is applied to the top surface of dummy die 112. The pressure 710 is distributed across dummy die 112 and spreads silicone-based glue 114. Depending on the amount of glue 114 applied between dies 102 and 112, glue 114 may fill in voids around each connection on pads 106, which are referred to as glue fillets 714 that laterally surround and contact wire bonds 702 and glue fillets 712 that may be pushed out around lateral edges of the dies 102 and 112. The glue fillets 714 extend the air tight seal to cover the active side 103 in areas around the pads 106 that might otherwise be exposed to the ambient environment if the glue fillets 714 were not present. Glue fillets may be especially beneficial when a sensitive area 104 extends under a pad, like that shown in FIG. 7B, to ensure that the underlying sensitive area 104 is sealed. In some embodiments, silicone-based glue 114 may be cured after the glue fillets are formed. Fillets 714 (e.g., the portion of the device within the circle shown in FIG. 7B) are shown in additional detail in FIG. 8A-8D.

Figure 8A:
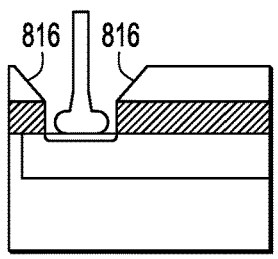

FIG. 8A shows an example wire bond formed on a pad within an opening of the dummy die 112. In the embodiment shown, the opening includes side walls 816 that have a positive slope, which are outward sloping side walls. A void is also shown as a space between the wire bond and the edges of the glue 114. FIG. 8B shows pressure applied to the dummy die 112, which spreads glue 114 into the void around the wire bond, forming fillet 820. In this manner, glue 114 is spread to provide an air tight seal around each wire bond. A fillet 810 is also formed at the lateral edges of the dies 102 and 112, which may be beneficial in some embodiments where the sensitive area 104 extends close to a lateral edge of semiconductor die 102.

Figure 8C:
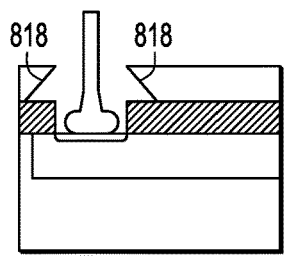
Figure 8B:
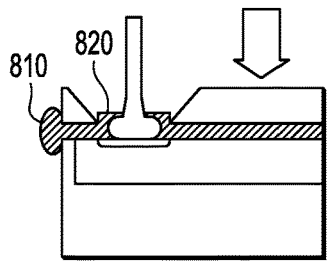
Figure 8D:
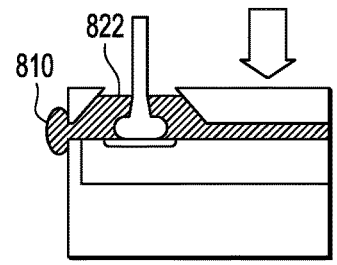

FIG. 8C another example wire bond formed on a pad within an opening of the dummy die 112. In the embodiment shown, the opening includes side walls 818 that have a negative slope, which are inward sloping side walls. A void is also shown as a space between the wire bond and the edges of the glue 114. FIG. 8D shows pressure applied to the dummy die 112, which spread glue 114 into the void around the wire bond, forming fillets 822 and 810.

In embodiments that include a stud bump on the pad and the wire bond is formed on top of the stud bump, silicone-based glue 114 may be similarly spread into the void around the stud bump. In embodiments that include a solder ball or bump on the pad, silicone-based glue 114 may also be similarly spread into the void around the solder ball or bump.

Figure 9A:
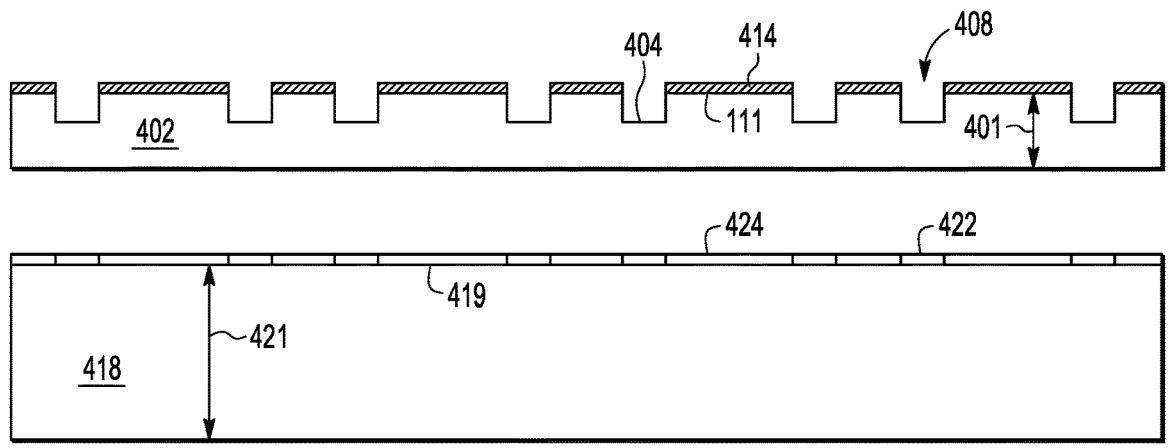
FIG. 9A-9D are block diagrams depicting other various wafer level steps for fabricating an example semiconductor device, according to some embodiments of the present disclosure.

FIG. 9A-9D show cross-sectional views of various steps of an example process flow for fabricating an example device at wafer level. FIG. 9A shows an example dummy die wafer 402 that includes a plurality of dummy dies 112 and has a production thickness 401, as similarly discussed above. A number of recesses 408 are formed in the top surface 111 to a depth 404 that is substantially equivalent to the target thickness of the resulting dummy dies 112, as similarly discussed above. FIG. 9A also shows a layer of silicone-based glue 414 applied to the top surface 111, where a laser or plasma cleaning step may also be performed to keep recesses 408 clear of any glue 414, as similarly discussed above.

FIG. 9A also shows an example semiconductor die wafer 418 that includes a plurality of semiconductor dies 102 and has a production thickness 421. Semiconductor die wafer 418 is shown in an active side face-up orientation, where active side 419 of the semiconductor die wafer 418 includes a number of sensitive areas that may be in similar or different areas than those shown above, including extending under bond pads 422. A solder mask 424 is also shown around bond pads 422, where recesses 408 correspond to pads 422.

Figure 9B:
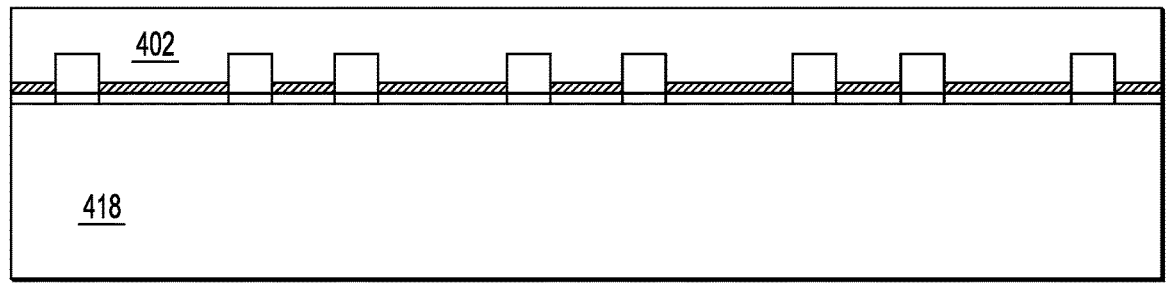
Figure 9C:
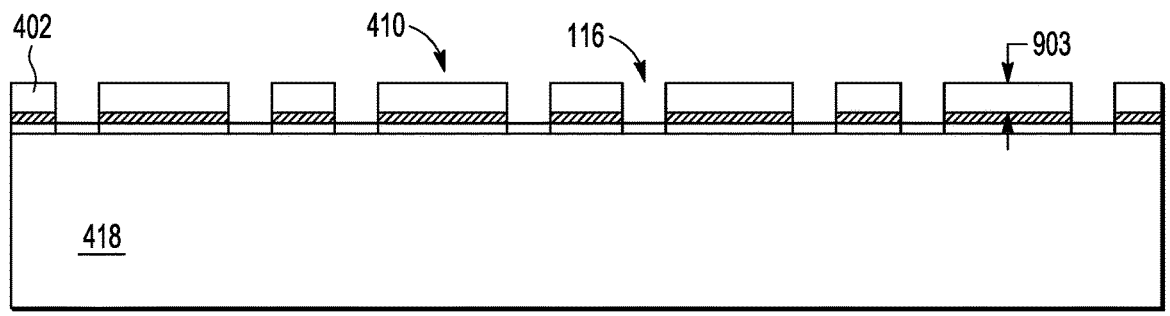

FIG. 9B shows the dummy die wafer 402 flipped in a face-down orientation and attached to semiconductor die wafer 418 with the silicone-based glue 414, where recesses 408 are aligned with pads 422. FIG. 9C shows a backgrinding step 410 that removes a portion of the dummy die wafer 402 down to depth 404, which exposes or opens recesses 408 into openings 116 through the dummy die wafer 402. It is noted that the resulting thickness 903 of the dummy die wafer 402 achieved by the backgrinding described in connection with FIG. 9C may be thinner than the resulting thickness 403 achieved by the backgrinding described in connection with FIG. 4B.

Figure 9D:
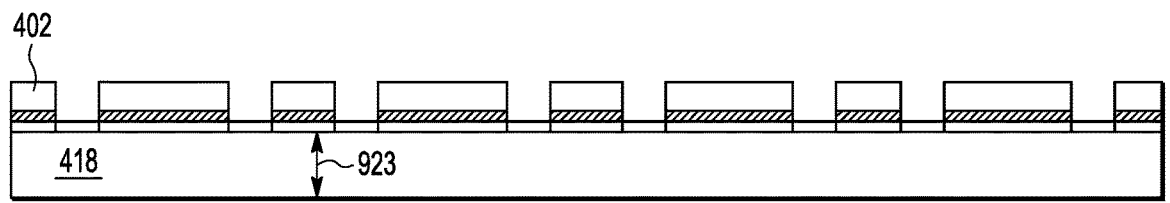

FIG. 9D shows a backgrinding step 428 that removes a portion of the semiconductor die wafer 418 down to a resulting thickness 923. It is noted that the resulting thickness 923 achieved by the backgrinding described in connection with FIG. 9D may be thinner than the resulting thickness 423 achieved by the backgrinding described in connection with FIG. 4E.

By now it should be appreciated that there has been provided a protection solution for stress-sensitive areas on an active side of a semiconductor die, where such areas are protected by a dummy die attached to and covering the stress-sensitive areas with silicone-based glue. The dummy die includes a number of openings through the dummy die that align with the bond pads on the underlying semiconductor die, where each opening laterally surrounds one or more bond pads when attached to the semiconductor die. The dummy die is attached to the semiconductor die before wire bonding or other connection attachment (e.g., solder balls or bumps), which is performed on the pads through the openings in the dummy die. The silicone-based glue provides an air tight and moisture resistant seal on the active side of the semiconductor die, protecting the sensitive areas from various thermal, mechanical, and electrothermal stresses.

In one embodiment of the present disclosure, a packaged semiconductor device is provided, which includes: a semiconductor die having a plurality of pads on an active side; a dummy die having a plurality of openings that extend from a first major surface to a second major surface opposite the first major surface, wherein the plurality of openings are aligned with the plurality of pads; and a silicone-based glue attaching the dummy die to the active side of the semiconductor die, wherein a plurality of bondable surfaces of the semiconductor die are exposed through the plurality of openings of the dummy die.

One aspect of the above embodiment provides that each opening of the dummy die is aligned to a respective pad of the semiconductor die, and a portion of the dummy die is located between adjacent pads.

Another aspect of the above embodiment provides that the dummy die has a perimeter that corresponds to a perimeter of the semiconductor die.

Another aspect of the above embodiment provides that the semiconductor die includes a stress-sensitive area on the active side, wherein the dummy die covers the stress-sensitive area.

A further aspect of the above embodiment provides that the dummy die has a perimeter that extends beyond a perimeter of the stress-sensitive area by a minimum distance.

Another further aspect of the above embodiment provides that the stress-sensitive area extends underneath at least one of the plurality of pads on the semiconductor die.

Another aspect of the above embodiment provides that the dummy die has a thickness in a range between 10 and 100 microns.

Another aspect of the above embodiment provides that the silicone-based glue has a thickness in a range between 20 and 50 microns.

Another aspect of the above embodiment provides that a portion of the plurality of openings are located in a peripheral part of the dummy die.

Another aspect of the above embodiment provides that a portion of the plurality of openings are located in a central part of the dummy die.

Another aspect of the above embodiment provides that top surfaces of the plurality of pads provide the plurality of bondable surfaces.

Another aspect of the above embodiment provides that the packaged semiconductor device further includes: a plurality of stud bumps formed on the plurality of pads, wherein top surfaces of the plurality of stud bumps provide the plurality of bondable surfaces.

A further aspect of the above embodiment provides that the packaged semiconductor device further includes: a fillet of the silicone-based glue laterally surrounding and contacting each stud bump, wherein the fillet provides a sealed barrier over the active surface of the semiconductor die within each opening of the dummy die.

Another aspect of the above embodiment provides that the packaged semiconductor device further includes: an under bump metallization (UBM) layer formed on the plurality of pads, wherein top surfaces of the UBM layer on the plurality of pads provide the plurality of bondable surfaces.

A further aspect of the above embodiment provides that the packaged semiconductor device further includes: a plurality of solder bumps attached to the UBM layer on the plurality of pads, and a fillet of the silicone-based glue laterally surrounding and contacting each solder bump, wherein the fillet provides a sealed barrier over the active surface of the semiconductor die within each opening of the dummy die.

Another aspect of the above embodiment provides that the packaged semiconductor device further includes: a plurality of ball bonds attached to the plurality of bondable surfaces within each opening of the dummy die.

A further aspect of the above embodiment provides that the packaged semiconductor device further includes: a fillet of the silicone-based glue laterally surrounding and contacting each ball bond, wherein the fillet provides a sealed barrier over the active surface of the semiconductor die within each opening of the dummy die.

Another further aspect of the above embodiment provides that the packaged semiconductor device further includes: a lead frame having a die flag and a plurality of lead fingers, wherein a back side of the semiconductor die is attached to the die flag with die attach material, and the plurality of ball bonds are part of a plurality of wire bond interconnects that also include tail bonds attached to the plurality of lead fingers.

A still further aspect of the above embodiment provides that the packaged semiconductor device further includes: an encapsulant body that encapsulates the lead frame, the semiconductor die, the dummy die, and the plurality of wire bond interconnects.

Another aspect of the above embodiment provides that the semiconductor die is one of a plurality of semiconductor dies as part of a semiconductor die wafer, the dummy die is one of a plurality of dummy dies as part of a dummy die wafer, and the silicone-based glue attaches the dummy die wafer to the semiconductor die wafer, wherein the plurality of bondable surfaces of each of the plurality of semiconductor dies are exposed through the plurality of openings of each of the plurality of dummy dies.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is noted that the term "neighboring" as used herein means "adjacent to" (e.g., next to and without an intervening object), and "laterally" as used herein means "in a sideways direction" (e.g., a horizontal direction that is parallel to a plane of the substrate).

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value. Also as used herein, the term space indicates a void or volume in which material is absent.

Although the invention is described herein with reference to specific embodiments, various modifications and changes can be made without departing from the scope of the present invention as set forth in the claims below. For example, additional or fewer openings 116 may be implemented in FIG. 1A. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
   a semiconductor die having a plurality of pads on an active side;
   a dummy die having a plurality of openings that extend from a first major surface to a second major surface opposite the first major surface, wherein the plurality of openings are aligned with the plurality of pads;
   a silicone-based glue attaching the dummy die to the active side of the semiconductor die, wherein a plurality of bondable surfaces of the semiconductor die are exposed through the plurality of openings of the dummy die;
an under bump metallization (UBM) layer formed on the plurality of pads, wherein top surfaces of the UBM layer on the plurality of pads provide the plurality of bondable surfaces;
a plurality of solder bumps attached to the UBM layer on the plurality of pads, and
a fillet of the silicone-based glue laterally surrounding and contacting each solder bump, wherein the fillet provides a sealed barrier over the active surface of the semiconductor die within each opening of the dummy die.

2. The packaged semiconductor device of claim 1, wherein
each opening of the dummy die is aligned to a respective pad of the semiconductor die, and
a portion of the dummy die is located between adjacent pads.

3. The packaged semiconductor device of claim 1, wherein
the dummy die has a perimeter that corresponds to a perimeter of the semiconductor die.

4. The packaged semiconductor device of claim 1, wherein
the semiconductor die includes a stress-sensitive area on the active side, wherein the dummy die covers the stress-sensitive area.

5. The packaged semiconductor device of claim 4, wherein
the dummy die has a perimeter that extends beyond a perimeter of the stress-sensitive area by a minimum distance.

6. The packaged semiconductor device of claim 4, wherein
the stress-sensitive area extends underneath at least one of the plurality of pads on the semiconductor die.

7. The packaged semiconductor device of claim 1, wherein
the dummy die has a thickness in a range between 10 and 100 microns.

8. The packaged semiconductor device of claim 1, wherein
the silicone-based glue has a thickness in a range between 20 and 50 microns.

9. The packaged semiconductor device of claim 1, wherein
a portion of the plurality of openings are located in a peripheral part of the dummy die.

10. The packaged semiconductor device of claim 1, wherein
a portion of the plurality of openings are located in a central part of the dummy die.

11. The packaged semiconductor device of claim 1, wherein
the semiconductor die is one of a plurality of semiconductor dies as part of a semiconductor die wafer,
the dummy die is one of a plurality of dummy dies as part of a dummy die wafer, and
the silicone-based glue attaches the dummy die wafer to the semiconductor die wafer, wherein the plurality of bondable surfaces of each of the plurality of semiconductor dies are exposed through the plurality of openings of each of the plurality of dummy dies.

12. A packaged semiconductor device comprising:
a semiconductor die having a plurality of pads on an active side;
a dummy die having a plurality of openings that extend from a first major surface to a second major surface opposite the first major surface, wherein the plurality of openings are aligned with the plurality of pads; and
a silicone-based glue attaching the dummy die to the active side of the semiconductor die, wherein a plurality of bondable surfaces of the semiconductor die are exposed through the plurality of openings of the dummy die;
a plurality of stud bumps formed on the plurality of pads, wherein top surfaces of the plurality of stud bumps provide the plurality of bondable surfaces; and
a fillet of the silicone-based glue laterally surrounding and contacting each stud bump, wherein the fillet provides a sealed barrier over the active surface of the semiconductor die within each opening of the dummy die.

13. A packaged semiconductor device comprising:
a semiconductor die having a plurality of pads on an active side;
a dummy die having a plurality of openings that extend from a first major surface to a second major surface opposite the first major surface, wherein the plurality of openings are aligned with the plurality of pads; and
a silicone-based glue attaching the dummy die to the active side of the semiconductor die, wherein a plurality of bondable surfaces of the semiconductor die are exposed through the plurality of openings of the dummy die;
a plurality of ball bonds attached to the plurality of bondable surfaces within each opening of the dummy die; and
a fillet of the silicone-based glue laterally surrounding and contacting each ball bond, wherein the fillet provides a sealed barrier over the active surface of the semiconductor die within each opening of the dummy die.

14. A packaged semiconductor device comprising:
a semiconductor die having a plurality of pads on an active side;
a dummy die having a plurality of openings that extend from a first major surface to a second major surface opposite the first major surface, wherein the plurality of openings are aligned with the plurality of pads; and
a silicone-based glue attaching the dummy die to the active side of the semiconductor die, wherein a plurality of bondable surfaces of the semiconductor die are exposed through the plurality of openings of the dummy die;
a plurality of ball bonds attached to the plurality of bondable surfaces within each opening of the dummy die; and
a lead frame having a die flag and a plurality of lead fingers, wherein
a back side of the semiconductor die is attached to the die flag with die attach material, and
the plurality of ball bonds are part of a plurality of wire bond interconnects that also include tail bonds attached to the plurality of lead fingers.

15. The packaged semiconductor device of claim 14, further comprising:
an encapsulant body that encapsulates the lead frame, the semiconductor die, the dummy die, and the plurality of wire bond interconnects.

* * * * *